(12) United States Patent
Wang

(10) Patent No.: US 11,430,969 B2
(45) Date of Patent: Aug. 30, 2022

(54) ELECTROLUMINESCENT COMPONENT HAVING METAL LAYER DISPOSED BETWEEN TWO OF OPTICAL COUPLING LAYERS AND DISPLAY DEVICE HAVING THE SAME

(71) Applicant: WUHAN CHINA STAR OPTOELECTRONICS SEMICONDUCTOR DISPLAY TECHNOLOGY CO., LTD., Hubei (CN)

(72) Inventor: Bo Wang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 233 days.

(21) Appl. No.: 16/765,176

(22) PCT Filed: Nov. 7, 2019

(86) PCT No.: PCT/CN2019/116281
§ 371 (c)(1),
(2) Date: May 19, 2020

(87) PCT Pub. No.: WO2021/035960
PCT Pub. Date: Mar. 4, 2021

(65) Prior Publication Data
US 2021/0066662 A1    Mar. 4, 2021

(30) Foreign Application Priority Data
Aug. 28, 2019 (CN) .......................... 201910804164.2

(51) Int. Cl.
*H01L 29/08* (2006.01)
*H01L 51/52* (2006.01)
(Continued)

(52) U.S. Cl.
CPC ...... *H01L 51/5265* (2013.01); *H01L 51/5012* (2013.01); *H01L 51/5056* (2013.01);
(Continued)

(58) Field of Classification Search
CPC ............. H01L 51/5265; H01L 51/5012; H01L 51/5056; H01L 51/5072; H01L 51/0052
(Continued)

(56) References Cited

U.S. PATENT DOCUMENTS

2004/0021415 A1    2/2004  Vong et al.
2016/0254494 A1*   9/2016  Zhang ................. H01L 51/5265
                                                                257/40
(Continued)

FOREIGN PATENT DOCUMENTS

CN     103633256 A    3/2014
CN     103715372      4/2014
(Continued)

*Primary Examiner* — Phuc T Dang
(74) *Attorney, Agent, or Firm* — Mark M. Friedman

(57) ABSTRACT

An electroluminescent component and a display device are provided. The electroluminescent component has a light output side; a first electrode far away from the light output side; an organic light emitting structure layer disposed on the first electrode; a second electrode disposed on the organic light emitting structure layer; at least two optical coupling layers laminated on the second electrode; and at least one metal layer disposed between two of the optical coupling layers adjacent to each other.

10 Claims, 2 Drawing Sheets

(51) Int. Cl.
   *H01L 51/50* (2006.01)
   *H01L 51/00* (2006.01)
(52) U.S. Cl.
   CPC ........ *H01L 51/5072* (2013.01); *H01L 51/006* (2013.01); *H01L 51/0052* (2013.01); *H01L 51/0059* (2013.01); *H01L 51/0067* (2013.01); *H01L 51/0072* (2013.01); *H01L 51/5218* (2013.01); *H01L 51/5234* (2013.01); *H01L 2251/558* (2013.01)
(58) Field of Classification Search
   USPC .......................................................... 257/40
   See application file for complete search history.

(56) References Cited

U.S. PATENT DOCUMENTS

| | | | |
|---|---|---|---|
| 2017/0018740 A1 | 1/2017 | Shinotsuka et al. | |
| 2017/0187003 A1* | 6/2017 | Lei ..................... | H01L 51/5076 |
| 2017/0271624 A1* | 9/2017 | Hua ..................... | H01L 51/5275 |
| 2017/0309833 A1* | 10/2017 | Lei ..................... | H01L 51/0072 |
| 2018/0190940 A1 | 7/2018 | Liu et al. | |

FOREIGN PATENT DOCUMENTS

| | | |
|---|---|---|
| CN | 105720208 A | 6/2016 |
| CN | 106953020 A | 7/2017 |
| CN | 107808934 A | 3/2018 |
| CN | 109309176 A | 2/2019 |
| JP | 6413518 B2 | 10/2018 |
| WO | 2013099915 A1 | 7/2013 |

* cited by examiner ical field,
ELECTROLUMINESCENT COMPONENT HAVING METAL LAYER DISPOSED BETWEEN TWO OF OPTICAL COUPLING LAYERS AND DISPLAY DEVICE HAVING THE SAME

FIELD OF INVENTION

The present disclosure relates to a display technical field, and specifically, to an electroluminescent component and a display device.

BACKGROUND OF INVENTION

Organic light-emitting displays (OLEDs) have become one of the most important display technologies today due to their outstanding features such as no backlight, high contrast, and ultra-thinness. They are gradually replacing thin-film transistor liquid crystal displays (TFT-LCDs) and are expected to become the next-generation mainstream display technology after LCDs. How to improve the luminous efficiency and lifetime of OLEDs has been a problem that R&D personnel keep exploring.

Because the top-emitting electroluminescent component has a large aperture ratio, most of the industrialized OLEDs currently use top-emitting device structures. In the top-emitting light electroluminescent component, the light-emission coupling is of great significance to the improvement of OLED performance.

In the prior art, although an optical coupling layer is added to the organic light emitting structure layer to improve the luminous efficiency, in some display devices, these display devices cannot meet the luminous efficiency requirements. Therefore, it is necessary to further improve the electroluminescent component to improve the luminous efficiency.

SUMMARY OF DISCLOSURE

Technical Problem

In order to solve the above technical problem, the present disclosure provides an electroluminescent component and a display device, in which a metal layer is added into the optical coupling layers to increase the number of reflections and improve luminous efficiency.

Technical Solutions

Technical solutions for solving the above problems are: the present disclosure provides an electroluminescent component comprising a light output side; a first electrode far away from the light output side; an organic light emitting structure layer disposed on the first electrode; a second electrode disposed on the organic light emitting structure layer; at least two optical coupling layers laminated on the second electrode; and at least one metal layer disposed between two of the optical coupling layers adjacent to each other.

In one embodiment of the present disclosure, each of the optical coupling layers has a refractive index ranging from 1.7 to 2.5; and each of the optical coupling layers has a thickness ranging from 10 nm to 90 nm.

In one embodiment of the present disclosure, the optical coupling layer is a luminescent material, or the optical coupling layer doped with a luminescent material.

In one embodiment of the present disclosure, the luminescent material comprises at least one of a fluorescence luminescent material, a phosphorescent luminescent material, and a delayed fluorescence luminescent material.

In one embodiment of the present disclosure, the metal layer has a thickness ranging from 0.5 nm to 3 nm with a light transmittance ranging from 50% to 70%; and a light reflectance ranging from 30% to 50%.

In one embodiment of the present disclosure, the metal layer is at least one of ytterbium, copper, gold, silver, and magnesium.

In one embodiment of the present disclosure, the number of the metal layer is two or more, and materials of the metal layers are same or different.

In one embodiment of the present disclosure, the organic light emitting structure layer comprises a hole transport layer disposed on the first electrode; a luminescent layer disposed on the hole transport layer; an electron transport layer disposed on the luminescent layer; and the second electrode disposed on the electron transport layer.

In one embodiment of the present disclosure, the hole transport layer has a thickness ranging from 40 nm to 150 nm, and the material of the hole transport layer is at least one of 4,4',4''-tris[2-naphthylphenylamino]triphenylamine, N,N'-diphenyl-N,N'-(1-naphthyl)-1,1'-biphenyl-4,4'-diamine, and 4,4'-cyclohexylbis[N,N-bis(4-methylphenyl)] aniline; the luminescent layer has a thickness ranging from 20 nm to 50 nm with a blue light luminescent material, wherein the blue light luminescent material is 2-methyl-9, 10-bis(2-naphthyl)anthracene; the electron transport layer has a thickness ranging from 20 nm to 80 nm, and the material of the electron transport layer is at least one of 1,3,5-tris(1-phenyl-1H-benzimidazol-2-yl)benzene, 4,7-diphenyl-1,10-phenanthroline, and 1,3,5-tris[(3-pyridyl)-3-phenyl] benzene; the first electrode is an anode which is a reflective electrode with a laminated structure of indium tin oxide/silver/indium tin oxide (ITO/Ag/ITO); and the second electrode is a cathode which is a transparent electrode with a material of at least one of ytterbium, calcium, magnesium, and silver.

The present disclosure further provides a display device comprising the electroluminescent component.

The electroluminescent component and the display device of the present disclosure have a transparent metal layer between the adjacent two optical coupling layers to increase reflection times of a part of the light. In the conventional electroluminescent component, this light cannot pass through the optical coupling layer at one time, and a part of the light may stay in the electroluminescent component, thereby causing light energy loss. Therefore, adding a metal layer can effectively increase the luminous efficiency of light. The luminous efficiency can be further improved by doping a luminescent material in the optical coupling layers or by using a luminescent material as the whole optical coupling layer.

BRIEF DESCRIPTION OF DRAWINGS

In order to more clearly illustrate the technical solutions in the embodiment or in the present disclosure, the following drawings, which are intended to be used in the description of the embodiment or of the present disclosure, will be briefly described. It is understood that the drawings described below are merely some embodiments of the present disclosure, and it will be possible to those skilled in the art to obtain other drawings according to these drawings without creative efforts.

The present disclosure is further explained with reference to the accompanying drawings and embodiments.

REFERENCE NUMERALS

Figure 1:
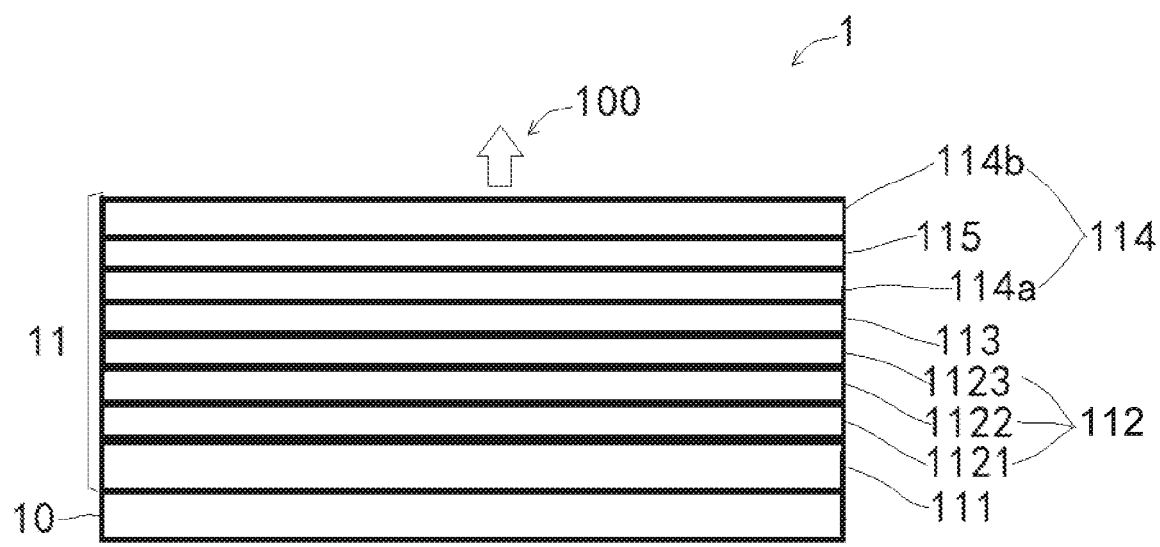
FIG. 1 is a structural view of a display device according to Embodiment 1 of the present disclosure.

1: display device; 10: array substrate;
11: electroluminescent component; 12: current electroluminescent component;
100: light output side; 111: first electrode; 112: organic light emitting structure layer;
113: second electrode; 114: optical coupling layer;
115: metal layer; 1121: hole transport layer;
1122: luminescent layer; 1123: electron transport layer;
114a: first optical coupling layer; 114b: second optical coupling layer;
114c: third optical coupling layer; 114d: fourth optical coupling layer;
114e: fifth optical coupling layer; 115a: first metal layer;
115b: second metal layer.

DETAILED DESCRIPTION OF PREFERRED EMBODIMENTS

Hereinafter, embodiments of the present disclosure will be described in detail. Examples of the embodiments are shown in the accompanying drawings, in which the same or similar reference numerals indicate the same or similar elements or elements having the same or similar functions. The embodiments described below with reference to the drawings are exemplary, and are only used to explain the present disclosure, but should not be construed as limiting the present disclosure.

Directional terms described by the disclosure, such as upper, lower, front, back, left, right, top, bottom, etc., are only directions by referring to the accompanying drawings, and thus the directional terms are used to describe and understand the present disclosure, but the present disclosure is not limited thereto.

Embodiment 1

Referring to FIG. 1, an electroluminescent component 11 of the present disclosure comprises a light output side 100, a first electrode 111, an organic light emitting structure layer 112, a second electrode 113, at least two optical coupling layers 114, and a metal layer 115.

The first electrode 111 is an anode which is a reflective electrode, is disposed far away from the light output side 100. The first electrode 111 is a laminated structure of indium tin oxide/silver/indium tin oxide (ITO/Ag/ITO).

The organic light emitting structure layer 112 is disposed on the first electrode 111. The organic light emitting structure layer 112 comprises a hole transport layer 1121, a luminescent layer 1122, an electron transport layer 1123. The hole transport layer 1121 is deposited on the first electrode 111 by a vacuum evaporation. The hole transport layer 1121 has a thickness ranging from 40 nm to 150 nm, and the material of the hole transport layer is at least one of 4,4',4''-tris[2-naphthylphenylamino]triphenylamine, N, N'-diphenyl-N,N'-(1-naphthyl)-1,1'-biphenyl-4,4'-diamine, and 4,4'-cyclohexylbis[N,N-bis(4-methylphenyl)] aniline. The luminescent layer 1122 is disposed on the hole transport layer 1121. The luminescent layer 1122 has a thickness ranging from 20 nm to 50 nm. The luminescent layer 1122 contains small organic molecules which belong to a blue light luminescent material. In this embodiment, the blue light luminescent material is 2-methyl-9,10-bis(2-naphthyl) anthracene. The electron transport layer 1123 is deposited on the luminescent layer 1122 by a vacuum evaporation. The electron transport layer 1123 has a thickness ranging from 20 nm to 80 nm and the material of the electron transport layer is at least one of 1,3,5-tris(1-phenyl-1H-benzimidazol-2-yl)benzene, 4,7-diphenyl-1,10-phenanthroline, and 1,3,5-tris[(3-pyridyl)-3-phenyl]benzene.

The second electrode 113 is disposed on the organic light emitting structure layer 112, and specifically on the electron transport layer 1123. The second electrode 113 is a cathode which is a transparent electrode with a material of at least one of ytterbium, calcium, magnesium, and silver.

There are at least two optical coupling layers 114 laminated on the second electrode 113. In this embodiment, the optical coupling layer 114 is provided in two layers including a first optical coupling layer 114a and a second optical coupling layer 114b. The first optical coupling layer 114a is disposed on the second electrode 113, and the second optical coupling layer 114b is disposed on the first optical coupling layer 114a. The optical coupling layer 114 has a refractive index ranging from 1.7 to 2.5. The optical coupling layer 114 has a thickness ranging from 10 nm to 90 nm. The metal layer 115 is provided in one layer. A layer of the metal layer 115 is disposed between the adjacent two optical coupling layers 114. The metal layer 115 has a thickness ranging from 0.5 nm to 3 nm with a light transmittance ranging from 50% to 70%; and a light reflectance ranging from 30% to 50%.

In this embodiment, since the light is reflected back and forth between the first electrode 111, the second electrode 113, and the metal layer 115, a part of the light is absorbed by the material, thereby causing some energy loss when the light passes through the first optical coupling layer 114a disposed on the second electrode 113. In order to reduce the impact of this problem, in this embodiment, the thickness of the first optical coupling layer 114a is reduced, preferably, to 10 nm. However, in order to increase the optical coupling effect and improve the luminous efficiency, the thickness of the optical coupling layer 114 cannot be too thin. Therefore, in this embodiment, the second optical coupling layer 114b disposed on the metal layer 115 has a thickness of 80 nm, preferably.

Similarly, in order to increase the luminous efficiency of the light, in this embodiment, a thinner transparent metal layer 115 is disposed between the first optical coupling layer 114a and the second optical coupling layer 114b to increase the reflection times of a part of the light. In conventional electroluminescent component 11, this light cannot pass through the optical coupling layer 114 at one time; a portion of the light stays in the electroluminescent component 11 and causes light energy loss. Therefore, adding a metal layer 115 can increase the luminous efficiency of light. Since the metal layer 115 itself causes a certain light absorption, the metal layer 115 cannot be too thick. In this embodiment, the metal layer 115 has a preferred thickness of 1 nm. Further, in order to increase the reflection effect of light while maintaining the light emission effect, it is necessary to consider not only the thickness of the metal layer 115, but also the light transmittance and reflectivity of the metal layer 115. Thus, in this embodiment, the light transmittance of the metal layer 115 is preferably 60%; and the light reflectance is preferably 38%-40%.

As for the material used for the metal layer 115, at least one of ytterbium, copper, gold, silver, and magnesium may be used.

In order to further increase the luminous efficiency of light, in this embodiment, a luminescent material may be doped in the optical coupling layer 114, or a material used in the entire optical coupling layer 114 is a luminescent material. The luminescent material comprises at least one of a fluorescence luminescent material, a phosphorescent luminescent material, and a delayed fluorescence luminescent material. In this embodiment, the luminescent material used in the optical coupling layer 114 may be consistent with the luminescent material used in the luminescent layer 1122. When the optical coupling layer 114 is doped with a luminescent material, the host material may be selected from the materials used for the hole transport layer.

As shown in FIG. 1, this embodiment further provides a display device 1 comprises the electroluminescent component 11 of this embodiment. The electroluminescent component 11 is disposed on the array substrate 10. The improvement point of the present disclosure lies on the electroluminescent component 11, and therefore other components, such as a color filter substrate of the display device 1, in the present disclosure are not described in detail.

Embodiment 2

Figure 2:
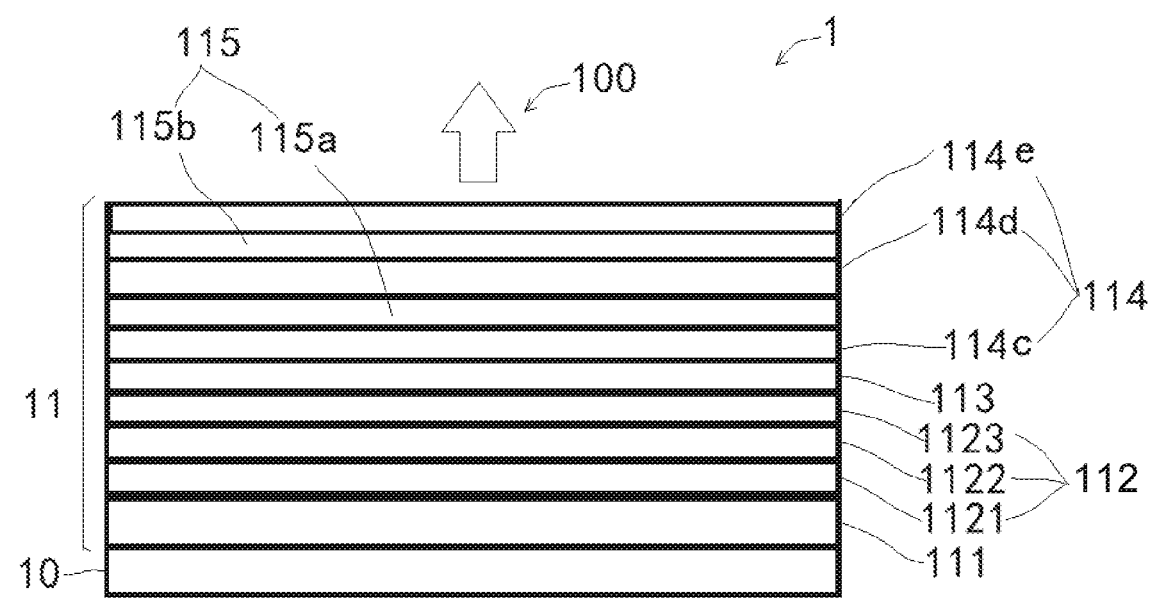
FIG. 2 is a structural view of a display device according to Embodiment 2 of the present disclosure.

As shown in FIG. 2, the difference between the electroluminescent component 11 of this embodiment and that of Embodiment 1 is that there are three optical coupling layers 114 and two metal layers 115.

The three optical coupling layers 114 include a third optical coupling layer 114c, a fourth optical coupling layer 114d, and a fifth optical coupling layer 114e. The metal layers 115 comprise a first metal layer 115a and a second metal layer 115b. Specifically, the third optical coupling layer 114c is disposed on the second electrode 113, the first metal layer 115a is disposed on the third optical coupling layer 114c, the fourth optical coupling layer 114d is disposed on the first metal layer 115a, the second metal layer 115b is disposed on the fourth optical coupling layer 114, and the fifth optical coupling layer 114e is disposed on the second metal layer 115b.

For increasing the luminous efficiency of the light, in this embodiment, the first metal layer 115a and the second metal layer 115b both have thicknesses of 0.5 nm. When the number of the metal layers 115 is two or more, materials of the metal layers 115 are same or different. The third optical coupling layer 114c and the fourth optical coupling layer 114d both have thicknesses of 10 nm. The fifth optical coupling layer 114e has a thickness of 70 nm or 80 nm.

As shown in FIG. 2, this embodiment further provides a display device 1 comprising the electroluminescent component 11 of this embodiment. The electroluminescent component 11 is disposed on the array substrate 10. The improvement point of the present disclosure lies on the electroluminescent component 11, and therefore other components, such as a color filter substrate of the display device, 1 in the present disclosure are not described in detail.

Figure 3:
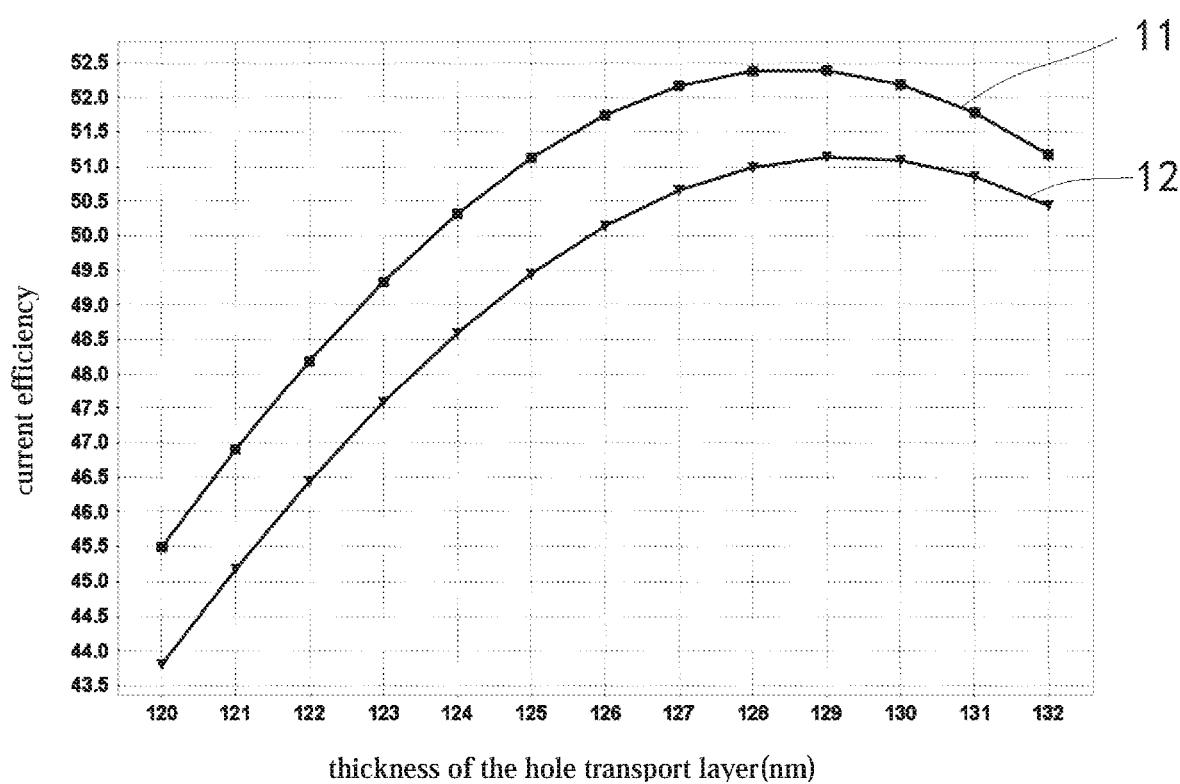
FIG. 3 is a luminous efficiency diagram of the electroluminescent component of the present disclosure and the current electroluminescent component simulated by the optical simulation software setfos4.0.

The luminous efficiency of the electroluminescent component 11 according to the present disclosure is further described below with reference to FIG. 3. FIG. 3 is a luminous efficiency diagram of the electroluminescent component 11 of the present disclosure and the conventional electroluminescent component 12 simulated by the optical simulation software setfos4.0, in which the horizontal coordinate is a thickness of the hole transport layer 1121 (HTL). By adjusting the thickness of the hole transport layer 1121 (HTL), the chromaticity efficiency (Blue Index, current efficiency/color coordinate) can be modified.

It can be known from FIG. 3 that the luminous efficiency of the electroluminescent component in the present disclosure is significantly higher than that of the conventional electroluminescent component under the same thickness of the hole transport layer 1121 (HTL).

The above mentioned is only preferred embodiments of the present disclosure, and are not intended to limit the present disclosure. Any modification, equivalent replacement, and improvement made within the spirit and principle of the present disclosure shall be included in the protection scope of the present disclosure.

What is claimed is:

1. An electroluminescent component, comprising:
a light output side;
a first electrode far away from the light output side;
an organic light emitting structure layer disposed on the first electrode;
a second electrode disposed on the organic light emitting structure layer;
at least two optical coupling layers laminated on the second electrode; and
at least one metal layer disposed between two of the optical coupling layers adjacent to each other.

2. The electroluminescent component according to claim 1, wherein each of the optical coupling layers has a refractive index ranging from 1.7 to 2.5; and each of the optical coupling layers has a thickness ranging from 10 nm to 90 nm.

3. The electroluminescent component according to claim 1, wherein the optical coupling layer is a luminescent material, or the optical coupling layer doped with a luminescent material.

4. The electroluminescent component according to claim 3, wherein the luminescent material comprises at least one of a fluorescence luminescent material, a phosphorescent luminescent material, and a delayed fluorescence luminescent material.

5. The electroluminescent component according to claim 1, wherein the metal layer has a thickness ranging from 0.5 nm to 3 nm with a light transmittance ranging from 50% to 70%; and a light reflectance ranging from 30% to 50%.

6. The electroluminescent component according to claim 1, wherein the metal layer is at least one of ytterbium, copper, gold, silver, and magnesium.

7. The electroluminescent component according to claim 6, wherein the number of the metal layer is two or more, and materials of the metal layers are same or different.

8. The electroluminescent component according to claim 1, wherein the organic light emitting structure layer comprises
a hole transport layer disposed on the first electrode;
a luminescent layer disposed on the hole transport layer;
an electron transport layer disposed on the luminescent layer; and
the second electrode disposed on the electron transport layer.

9. The electroluminescent component according to claim 7, wherein the hole transport layer has a thickness ranging from 40 nm to 150 nm, and the material of the hole transport layer is at least one of 4,4',4''-tris[2-naphthylphenylamino]

triphenylamine, N, N'-diphenyl-N,N'-(1-naphthyl)-1,1'-biphenyl-4,4'-diamine, and 4,4'-cyclohexylbis[N,N-bis(4-methylphenyl)]aniline;

the luminescent layer has a thickness ranging from 20 nm to 50 nm with a blue light luminescent material, wherein the blue light luminescent material is 2-methyl-9,10-bis(2-naphthyl)anthracene;

the electron transport layer has a thickness ranging from 20 nm to 80 nm, and the material of the electron transport layer is at least one of 1,3,5-tris(1-phenyl-1H-benzimidazol-2-yl)benzene, 4,7-diphenyl-1,10-phenanthroline, and 1,3,5-tris[(3-pyridyl)-3-phenyl]benzene;

the first electrode is an anode which is a reflective electrode with a laminated structure of indium tin oxide/silver/indium tin oxide (ITO/Ag/ITO); and the second electrode is a cathode which is a transparent electrode with a material of at least one of ytterbium, calcium, magnesium, and silver.

10. A display device, comprising the electroluminescent component according to claim 1.

* * * * *